(12) United States Patent
Im

(10) Patent No.: US 10,573,588 B2
(45) Date of Patent: Feb. 25, 2020

(54) PACKAGE SUBSTRATE AND SEMICONDUCTOR PACKAGE INCLUDING THE SAME

(71) Applicant: Samsung Electronics Co., Ltd., Suwon-si, Gyeonggi-do (KR)

(72) Inventor: Hohyeuk Im, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/987,976

(22) Filed: May 24, 2018

(65) Prior Publication Data

US 2019/0080994 A1     Mar. 14, 2019

(30) Foreign Application Priority Data

Sep. 11, 2017   (KR) .................. 10-2017-0116120

(51) Int. Cl.
   *H01L 23/498*   (2006.01)
   *H01L 23/00*    (2006.01)
   *H01L 23/528*   (2006.01)

(52) U.S. Cl.
   CPC .. *H01L 23/49816* (2013.01); *H01L 23/49811* (2013.01); *H01L 23/49822* (2013.01); *H01L 23/5283* (2013.01); *H01L 24/13* (2013.01); *H01L 24/16* (2013.01); *H01L 24/17* (2013.01); *H01L 24/81* (2013.01); *H01L 24/32* (2013.01); *H01L 24/73* (2013.01); *H01L 24/92* (2013.01); *H01L 2224/0401* (2013.01); *H01L 2224/10175* (2013.01); *H01L 2224/13012* (2013.01); *H01L 2224/13014* (2013.01); *H01L 2224/13082* (2013.01); *H01L 2224/13111* (2013.01); *H01L 2224/13139* (2013.01); *H01L 2224/13147* (2013.01); *H01L 2224/16237* (2013.01); *H01L 2224/16238* (2013.01); *H01L 2224/16507* (2013.01); *H01L 2224/32225* (2013.01); *H01L 2224/73204* (2013.01); *H01L 2224/81011* (2013.01); *H01L 2224/81191* (2013.01); *H01L 2224/81385* (2013.01); *H01L 2224/81815* (2013.01); *H01L 2224/92125* (2013.01);
   (Continued)

(58) Field of Classification Search
   None
   See application file for complete search history.

(56) References Cited

U.S. PATENT DOCUMENTS 7,884,482 B2   2/2011   Ozawa et al.
9,006,871 B2   4/2015   Fujisawa
(Continued)

FOREIGN PATENT DOCUMENTS

JP   2000-040715 A   2/2000
JP      4738983 B2   8/2011
(Continued)

*Primary Examiner* — Whitney Moore
(74) *Attorney, Agent, or Firm* — Harness, Dickey & Pierce, P.L.C.

(57) ABSTRACT

A package substrate and a semiconductor package are provided. The package substrate including a substrate body having a first surface on which a semiconductor chip is mounted and a second surface opposite to the first surface, and a conductive pad at the first surface, the conductive pad elongated in a first direction, the conductive pad including a plurality of sub-bar patterns spaced apart from each other in the first direction may be provided.

17 Claims, 10 Drawing Sheets

(52) U.S. Cl.
CPC .............. *H01L 2924/15311* (2013.01); *H01L 2924/3512* (2013.01)

(56) References Cited

U.S. PATENT DOCUMENTS

| | | |
|---|---|---|
| 9,799,621 B2 | 10/2017 | Lee et al. |
| 2005/0161779 A1 | 7/2005 | Peng et al. |
| 2009/0108447 A1 | 4/2009 | Jo et al. |
| 2016/0111347 A1* | 4/2016 | Kim .................. H01L 23/49816 257/778 |

FOREIGN PATENT DOCUMENTS

| | | |
|---|---|---|
| JP | 4956173 B2 | 6/2012 |
| KR | 10-2003-0032465 A | 4/2003 |
| KR | 10-2007-0056670 A | 6/2007 |
| KR | 10-2009-0041987 A | 4/2009 |
| KR | 10-1176348 B1 | 8/2012 |
| KR | 10-1616552 B1 | 4/2016 |
| KR | 10-1645771 B1 | 8/2016 |

\* cited by examiner

US 10,573,588 B2

PACKAGE SUBSTRATE AND SEMICONDUCTOR PACKAGE INCLUDING THE SAME

CROSS-REFERENCE TO RELATED APPLICATION

This U.S. non-provisional patent application claims priority under 35 U.S.C. § 119 to Korean Patent Application No. 10-2017-0116120, filed on Sep. 11, 2017, in the Korean Intellectual Property Office, the disclosure of which is hereby incorporated by reference in its entirety.

BACKGROUND

Example embodiments of the inventive concepts relate to package substrates and/or semiconductor packages including the same.

High-performance, high-speed, and small electronic components have been increasingly demanded with the development of an electronic industry. Various mounting techniques have been studied to meet these demands. Thus, semiconductor packages have been developed in the form of a ball grid array (BGA) package, a chip scale package (CSP), and a wafer level package (WLP). Further, semiconductor packages having complicated structures such as a multi-chip package (MCP), a multi-chip module (MCM), and a system in package (SIP) have also been developed. Meanwhile, a flip-chip bonding method and a wire bonding method have been developed as methods of connecting a semiconductor chip to a package substrate.

SUMMARY

Example embodiments of the inventive concepts may provide package substrates capable of preventing or mitigating a solder crack.

Example embodiments of the inventive concepts may also provide semiconductor packages with improved reliability.

According to an example embodiment, a package substrate may include a substrate body including a first surface on which a semiconductor chip is mounted and a second surface opposite to the first surface, and a conductive pad disposed at the first surface. The conductive pad may be elongated in a first direction, and the conductive pad may include a plurality of sub-bar patterns spaced apart from each other in the first direction.

According to an example embodiment, a package substrate may include a substrate body including a first surface on which a semiconductor chip is mounted and a second surface opposite to the first surface, and a conductive pad disposed at the first surface. The conductive pad may be elongated in a first direction, and the conductive pad may include trenches spaced apart from each other in the first direction. The trenches may expose the first surface.

According to an example embodiment, a semiconductor package may include a package substrate, a semiconductor chip mounted on the package substrate, and a mold layer covering the semiconductor chip. The package substrate may include a substrate body including a first surface on which the semiconductor chip is mounted and a second surface opposite to the first surface, and a conductive pad at the first surface. The conductive pad may be elongated in a first direction, and the conductive pad may include a plurality of sub-bar patterns spaced apart from each other in the first direction.

BRIEF DESCRIPTION OF THE DRAWINGS

The inventive concepts will become more apparent in view of the attached drawings and accompanying detailed description.

DETAILED DESCRIPTION

Hereinafter, example embodiments of the inventive concepts will be described in more detail with reference to the accompanying drawings.

Figure 1:
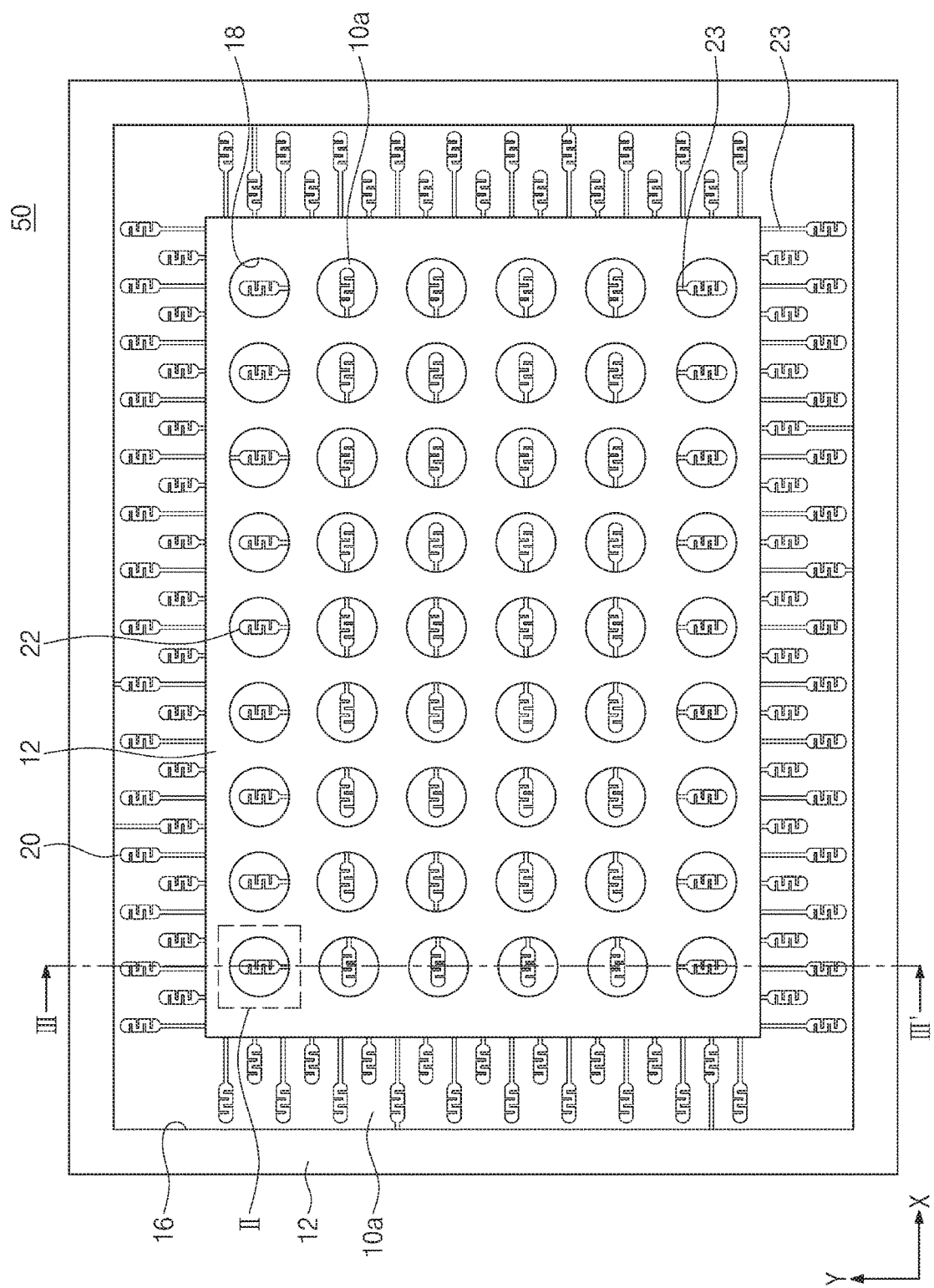
FIG. 1 is a plan view illustrating a package substrate according to some example embodiments of the inventive concepts.
Figure 2:
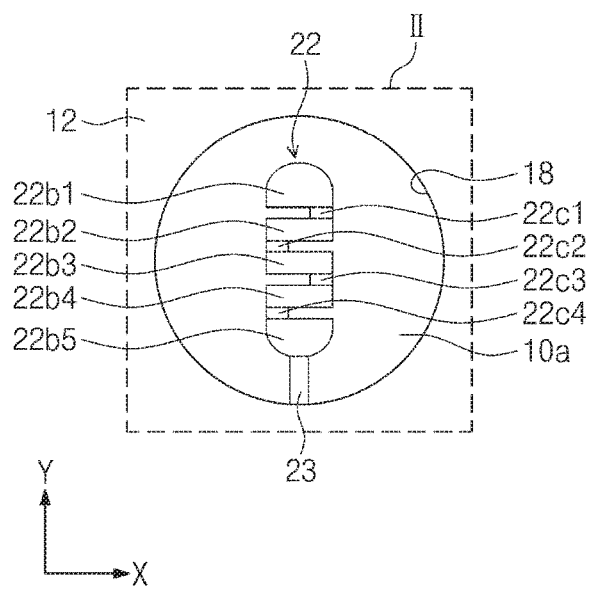
FIG. 2 is an enlarged view of a portion 'II' of FIG. 1.
Figure 3:
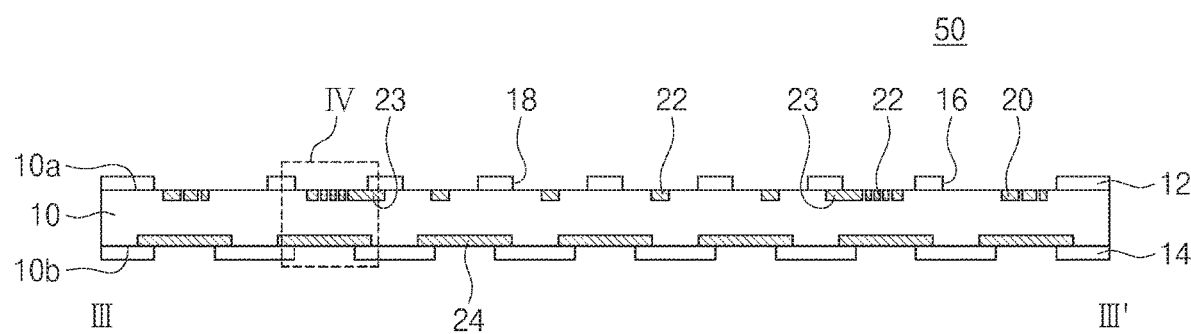
FIG. 3 is a cross-sectional view taken along a line III-III' of FIG. 1.
Figure 4:
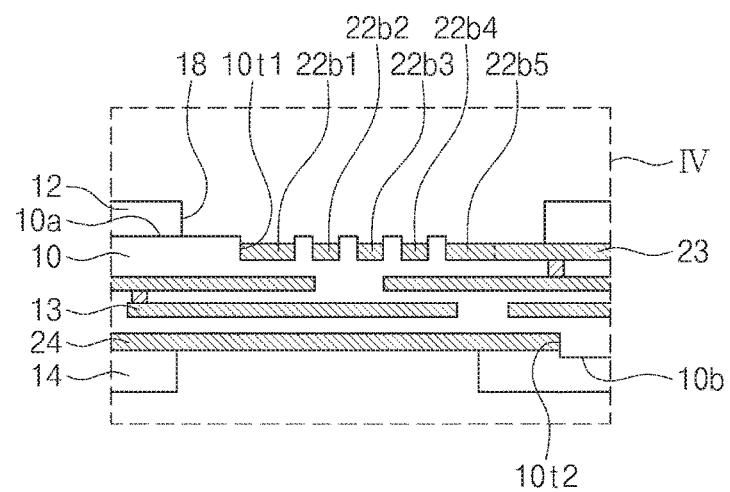
FIG. 4 is an enlarged view of a portion 'IV' of FIG. 3.

FIG. 1 is a plan view illustrating a package substrate according to some example embodiments of the inventive concepts. FIG. 2 is an enlarged view of a portion 'II' of FIG. 1. FIG. 3 is a cross-sectional view taken along a line III-III' of FIG. 1. FIG. 4 is an enlarged view of a portion 'IV' of FIG. 3.

Referring to FIGS. 1 to 4, a package substrate 50 according to some example embodiments of the inventive concepts includes a substrate body 10. The substrate body 10 includes a first surface 10a on which a semiconductor chip is mounted, and a second surface 10b opposite to the first surface 10a. The first surface 10a may be covered with a first protective layer 12. The second surface 10b may be covered with a second protective layer 14. The substrate body 10 may include a resin insulating layer. The resin insulating layer may include at least one of, but not limited to, a thermosetting resin (e.g., epoxy resin), a thermoplastic resin (e.g., polyimide), a resin (e.g., prepreg) obtained by impregnating the thermosetting resin or the thermoplastic resin with a reinforcing material (e.g., a glass fiber or an inorganic filler), or a photo-curable resin.

The first and second protective layers 12 and 14 may be solder resist layers. Each of the first and second protective layers 12 and 14 may include a photosensitive resin layer. The first protective layer 12 may include a first opening 16 disposed along an edge thereof, and second openings 18 disposed in a central portion thereof. The first opening 16 and the second openings 18 may partially expose the first surface 10a. Each of the second openings 18 may have a circular shape when viewed in a plan view. The first opening 16 may have a square ring shape when viewed in a plan view.

A plurality of first conductive pads 20 exposed by the first opening 16 and second conductive pads 22 exposed by the second openings 18 may be disposed at the first surface 10a of the substrate body 10. A distance between the first conductive pads 20 may be less than a distance between the second conductive pads 22. The first and second conductive pads 20 and 22 may be connected to first interconnection lines 23, respectively. The first interconnection lines 23 may also be disposed at the first surface 10a. Each of the second conductive pads 22 may be exposed through a corresponding one of the second openings 18. For example, all the first conductive pads 20 may be exposed through the first opening 16. The first and second conductive pads 20 and 22 and the first interconnection lines 23 may be formed of the same material. For example, the first and second conductive pads 20 and 22 and the first interconnection lines 23 may be formed of a metal (e.g., copper or gold).

Referring to FIGS. 1 and 2, the first and second conductive pads 20 and 22 may have the same shape when viewed in a plan view. An entire shape of each of the first and second conductive pads 20 and 22 may be a bar shape that is elongated (or has a relatively greater length (or extends)) in a first direction X or in a second direction Y intersecting the first direction X, when viewed in a plan view. In the present specification, a direction along which a length of each of the first and second conductive pads 20 and 22 is relatively longer may be defined as a longitudinal direction. For example, the second conductive pad 22 illustrated in FIG. 2 may be elongated or may have a relatively greater length in the second direction Y, and thus the second direction Y may be referred to as the longitudinal direction of the second conductive pad 22 of FIG. 2. In some example embodiments, the second conductive pads 22 disposed in a central portion in FIG. 1 may be elongated (or have a relatively greater length (or extend)) in the first direction X, and thus the first direction X may be referred to as the longitudinal direction thereof.

The first and second conductive pads 20 and 22 may have serpentine shapes when viewed in a plan view. For example, in FIG. 2, one second conductive pad 22 may include first to fifth sub-bar patterns 22b1 to 22b5 spaced apart from each other in the second direction Y, and first to fourth sub-connection patterns 22c1 to 22c4, each of which connects end portions of adjacent two of the first to fifth sub-bar patterns 22b1 to 22b5. In some example embodiments, the first to fourth sub-connection patterns 22c1 to 22c4 may be arranged in a zigzag form in the second direction Y. Distances in the second direction Y between the first to fifth sub-bar patterns 22b1 to 22b5 and widths of the first to fifth sub-bar patterns 22b1 to 22b5 in the second direction Y may be variously changed or modified. The first to fifth sub-bar patterns 22b1 to 22b5, the first to fourth sub-connection patterns 22c1 to 22c4, and the first interconnection line 23 connected to the fifth sub-bar pattern 22b5 may be connected to each other to constitute a single unitary body.

Referring to FIGS. 3 and 4, a plurality of first trenches 10t1 may be formed in the first surface 10a of the substrate body 10. The first and second conductive pads 20 and 22 and the first interconnection lines 23 may be disposed in the first trenches 10t1. A plurality of second trenches 10t2 may be formed in the second surface 10b of the substrate body 10. Ball lands 24 to which solder balls are bonded may be disposed in the second trenches 10t2, respectively. The first and second conductive pads 20 and 22 may not vertically overlap the first protective layer 12. Edge portions of the ball lands 24 may be covered with the second protective layer 14. The ball land 24 not covered by the second protective layer 14 may have a continuous surface, unlike the first and second conductive pads 20 and 22. Second interconnection lines 13 may be disposed within the substrate body 10. The second interconnection lines 13 may electrically connect the first and second conductive pads 20 and 22 to the ball lands 24 via an internal circuit. For example, the second interconnection lines 13 and the ball lands 24 may be formed of a metal (e.g., copper or gold). Top surfaces of the first and second conductive pads 20 and 22 and top surfaces of the first interconnection lines 23 may be lower than the first surface 10a.

Figure 5:
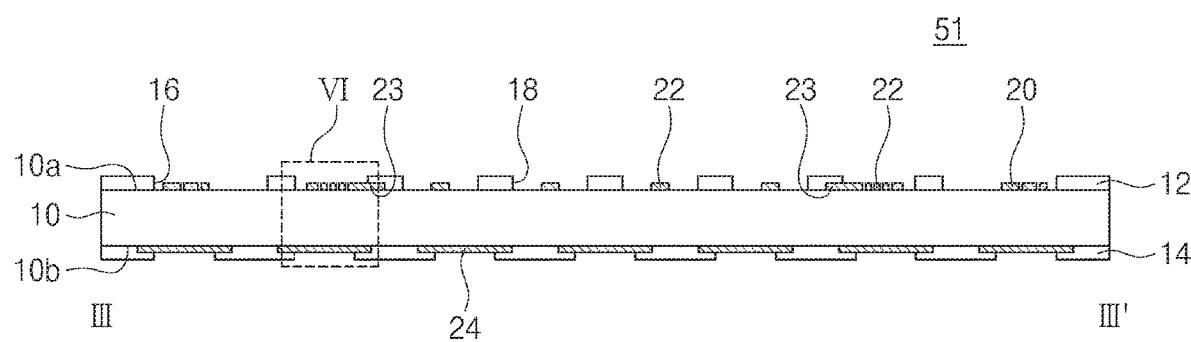
FIG. 5 is a cross-sectional view taken along the line III-III' of FIG. 1 to illustrate a package substrate according to some example embodiments of the inventive concepts.
Figure 6:
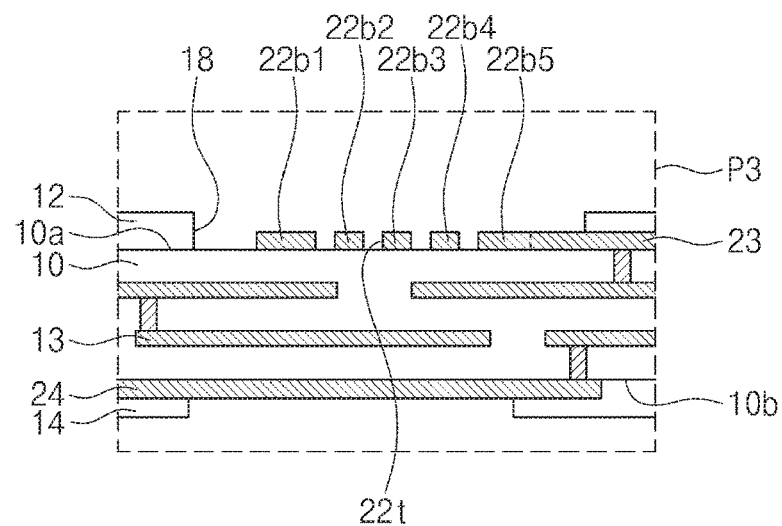
FIG. 6 is an enlarged view of a portion 'VI' of FIG. 5.

FIG. 5 is a cross-sectional view taken along the line III-III' of FIG. 1 to illustrate a package substrate according to some example embodiments of the inventive concepts. FIG. 6 is an enlarged view of a portion 'VI' of FIG. 5.

Referring to FIGS. 1, 2, 5, and 6, in a package substrate 51 according to the present example embodiment, first trenches 10t1 and second trenches 10t2 may not be formed in a first surface 10a and a second surface 10b of a substrate body 10, unlike FIG. 4. First and second conductive pads 20 and 22 and first interconnection lines 23 connected thereto may be disposed on the first surface 10a. Ball lands 24 may be disposed on the second surface 10b. Each of the first and second conductive pads 20 and 22 may include first to fifth sub-bar patterns 22b1 to 22b5 and first to fourth sub-connection patterns 22c1 to 22c4, which are disposed on the first surface 10a. Each of the first to fourth sub-connection patterns 22c1 to 22c4 may connect end portions of adjacent two of the first to fifth sub-bar patterns 22b1 to 22b5, and the first to fourth sub-connection patterns 22c1 to 22c4 may be arranged in a zigzag form in the second direction Y. A plurality of sub-bar trenches 22t exposing the first surface 10a may be defined between the first to fifth sub-bar patterns 22b1 to 22b5. The sub-bar trenches 22t may be spaced apart from each other in the second direction Y. Other elements of the package substrate 51 may be the same as or substantially similar to corresponding elements of the package substrate 50 of FIGS. 3 and 4.

Figure 7:
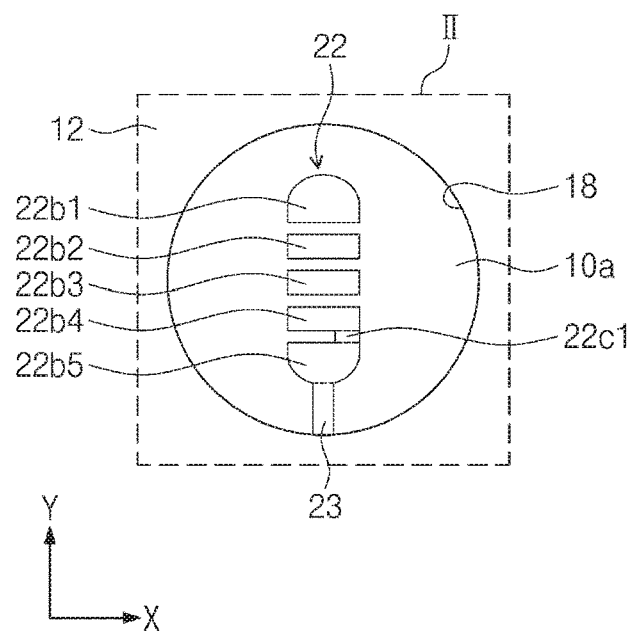
FIGS. 7 and 8 are enlarged views corresponding to the portion 'II' of FIG. 1 to illustrate package substrates according to some example embodiments of the inventive concepts.
Figure 8:
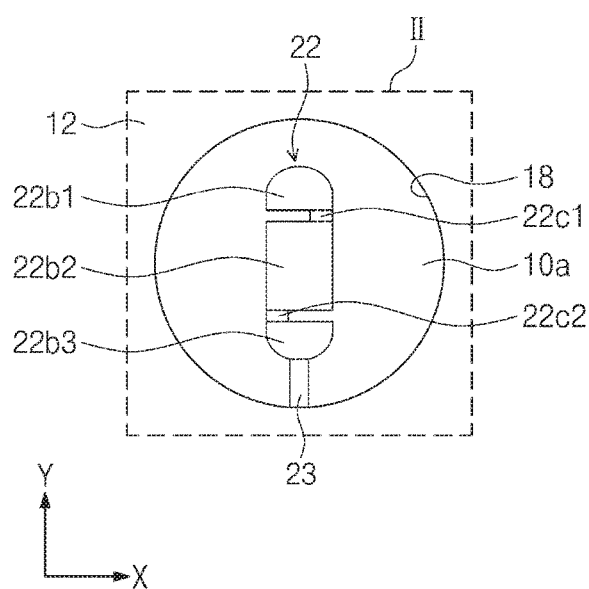

FIGS. 7 and 8 are enlarged views corresponding to the portion 'II' of FIG. 1 to illustrate package substrates according to some example embodiments of the inventive concepts.

Referring to FIG. 7, one second conductive pad 22 may include first to fifth sub-bar patterns 22b1 to 22b5 spaced apart from each other in the second direction Y. Further, the second conductive pad 22 may include a first sub-connection pattern 22c1 which connects the fourth sub-bar pattern 22b4 to the fifth sub-bar pattern 22b5.

As illustrated in FIG. 8, one second conductive pad 22 may include first to third sub-bar patterns 22b1 to 22b3 spaced apart from each other in the second direction Y. Further, the second conductive pad 22 may include a first sub-connection pattern 22c1 connecting the first sub-bar pattern 22*b*1 to the second sub-bar pattern 22*b*2, and a second sub-connection pattern 22*c*2 connecting the second sub-bar pattern 22*b*2 to the third sub-bar pattern 22*b*3. A width of the second sub-bar pattern 22*b*2 in the second direction Y may be greater than any of the widths of the first and third sub-bar patterns 22*b*1 and 22*b*3 in the second direction Y.

Each of the first and second conductive pads 20 and 22 according to the inventive concepts may have the structure including the plurality of sub-bar patterns spaced apart from each other in the longitudinal direction thereof as illustrated in FIGS. 1, 2, 7, and 8. Thus, a phenomenon that a solder layer spreads in the longitudinal direction in a subsequent process of mounting a semiconductor chip on the package substrate may be mitigated or prevented, thereby inhibiting, mitigating, or preventing a solder crack defect from occurring in a semiconductor package.

Each of the package substrates 50 and 51 may be used as a package substrate of a semiconductor package. In some example embodiments, each of the package substrates 50 and 51 may be used as an interposer substrate disposed between semiconductor chips in a multi-chip stack semiconductor package. When each of the package substrates 50 and 51 is used as the interposer substrate, the substrate body 10 may be formed of a semiconductor material.

Figure 9:
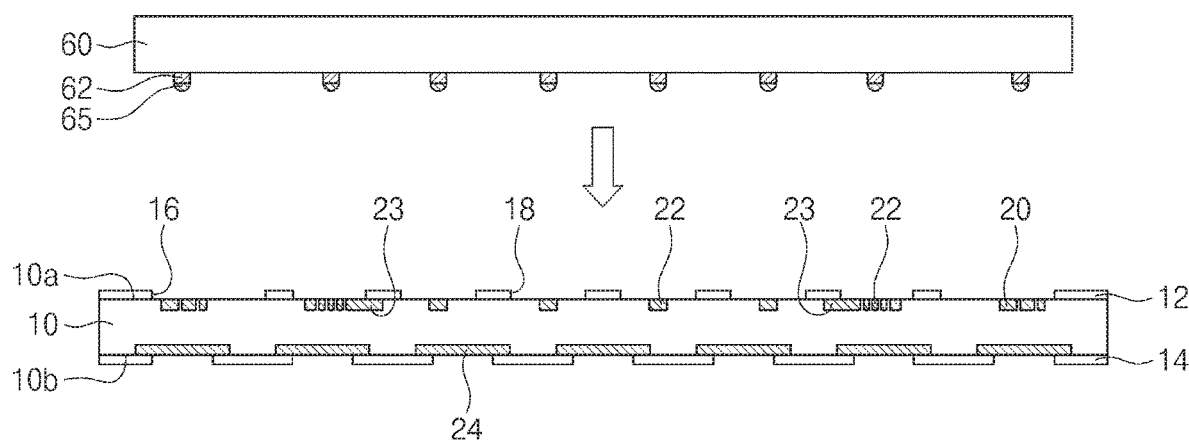
FIG. 9 is a cross-sectional view illustrating a process of mounting a semiconductor chip on a package substrate according to some example embodiments of the inventive concepts.
Figure 10:
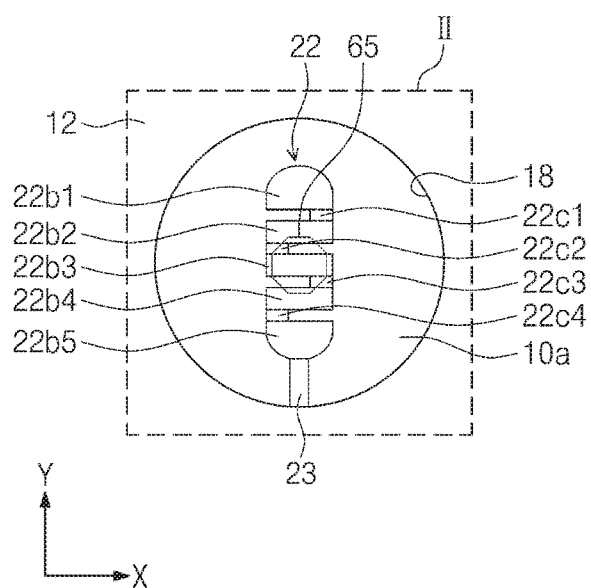
FIG. 10 is an enlarged view illustrating a position of a bump in FIG. 2.
Figure 11:
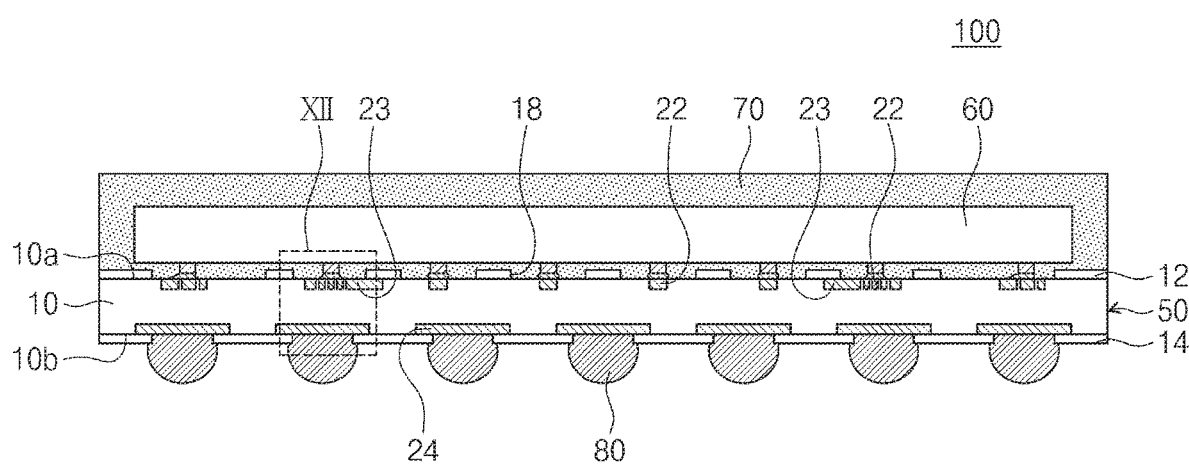
FIG. 11 is a cross-sectional view illustrating a semiconductor package according to some example embodiments of the inventive concepts.
Figure 12:
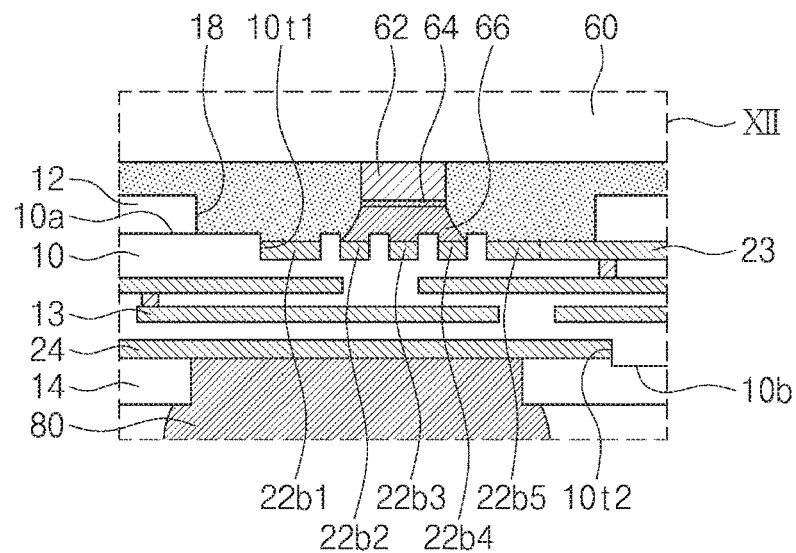
FIG. 12 is an enlarged view of a portion 'XII' of FIG. 11.

FIG. 9 is a cross-sectional view illustrating a process of mounting a semiconductor chip on a package substrate according to some example embodiments of the inventive concepts. FIG. 10 is an enlarged view illustrating a position of a bump in FIG. 2. FIG. 11 is a cross-sectional view illustrating a semiconductor package according to some example embodiments of the inventive concepts. FIG. 12 is an enlarged view of a portion 'XII' of FIG. 11.

Referring to FIGS. 9 and 10, a semiconductor chip 60 may be mounted on the package substrate 50 described with reference to FIGS. 3 and 4. The semiconductor chip 60 may include a plurality of bumps 62 disposed on a bottom surface thereof, and solder portions 65 adhered to bottom surfaces of the bumps 62, respectively. For example, the bumps 62 may be formed of a metal (e.g., copper). The solder portions 65 may include tin and silver. When the semiconductor chip 60 is mounted on the package substrate 50, a flux may be applied to the solder portions 65 and the solder portions 65 may be located on the first and second conductive pads 20 and 22, respectively. The bump 62 may have an octagonal shape or a circular shape when viewed in a plan view. A planar shape of the solder portion 65 may be the same as the planar shape of the bump 62. The solder portions 65 may be located on central portions of the first and second conductive pads 20 and 22, respectively.

Referring to FIGS. 9 to 12, a reflow process using heat may be performed to melt the solder portions 65. The flux may remove a metal oxide layer which may exist on surfaces of the first and second conductive pads 20 and 22 and surfaces of the solder portions 65. The solder portions 65 may be melted to be bonded to the first and second conductive pads 20 and 22, and thus the solder portions 65 may be formed into solder layers 66. At this time, a portion of the solder portion 65 may react with copper of the bump 62 to form an alloy layer 64 between the bump 62 and the solder layer 66. The alloy layer 64 may include, for example, copper, tin, and silver.

In the reflow process, a solder solution formed by melting the solder portion 65 may have good wettability with respect to the surfaces of the first and second conductive pads 20 and 22, but may have poor wettability with respect to a surface of the substrate body 10. If each of the first and second conductive pads 20 and 22 does not include the sub-bar patterns spaced apart from each other, the solder solution may spread in the longitudinal direction of each of the first and second conductive pads 20 and 22 (e.g., the second direction Y in FIG. 9). Thus, a finally formed solder layer 66 may be very thin, and thus the solder layer 66 may not be bonded to the conductive pad and/or a solder crack may occur in a final semiconductor package. However, according to the inventive concepts, because each of the first and second conductive pads 20 and 22 includes the sub-bar patterns spaced apart from each other, the solder solution may be inhibited, mitigated, or prevented from spreading in the longitudinal direction. Thus, a solder crack may be mitigated or prevented.

Subsequently, a mold layer 70 may be formed to cover the semiconductor chip 60 and the package substrate 50. The mold layer 70 may be formed of an epoxy-based resin. The mold layer 70 may also fill a space between the semiconductor chip 60 and the package substrate 50. In some example embodiments, the space between the semiconductor chip 60 and the package substrate 50 may be filled with an underfill resin layer or a non-conductive layer. Solder balls 80 may be bonded to the ball lands 24 of the package substrate 50 to manufacture a semiconductor package 100. The solder balls 80 may include, for example, tin and silver.

Referring to FIGS. 11 and 12, the semiconductor package 100 according to some example embodiments of the inventive concepts may include the semiconductor chip 60 mounted on the package substrate 50, the mold layer 70 covering the semiconductor chip 60 and the package substrate 50, and the solder balls 80 bonded to the package substrate 50. The package substrate 50 may be the same as or substantially similar to the package substrate described with reference to FIGS. 1 to 4. The finally formed solder layer 66 may also be in contact with an upper sidewall of the first trench 10*t*1 in which the first or second conductive pad 20 or 22 is disposed. In FIG. 12, the solder layer 66 may connect the second to fourth sub-bar patterns 22*b*2 to 22*b*4 spaced apart from each other. An interface between the solder ball 80 and the ball land 24 may be continuous in the first direction.

Figure 13:
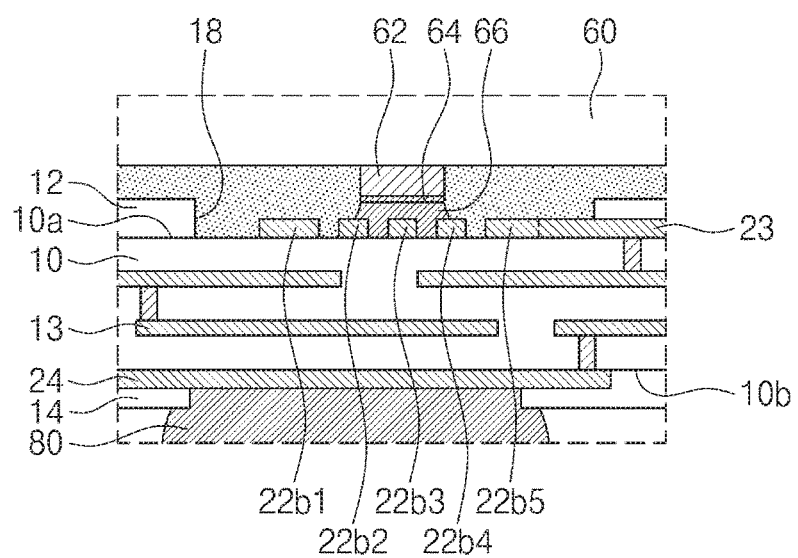
FIG. 13 is an enlarged view illustrating a portion of a semiconductor package including the package substrate of FIG. 5.

FIG. 13 is an enlarged view illustrating a portion of a semiconductor package manufactured by performing a process of mounting a semiconductor chip 60 on the package substrate 51 of FIG. 5, a process of forming a mold layer 70, and a process of bonding solder balls 80, as described with reference to FIGS. 9 to 12. Thus, the first and second conductive pads 20 and 22 and the first interconnection lines 23 connected thereto are disposed on the first surface 10*a*, and the ball lands 24 are disposed on the second surface 10*b*. Thus, a solder layer 66 may be formed to cover sidewalls of each of the first and second conductive pads 20 and 22. For example, the solder layer 66 may be in contact with the second to fourth sub-bar patterns 22*b*2 to 22*b*4 and may fill the sub-bar trenches 22*t* defined by and between the second to fourth sub-bar patterns 22*b*2 to 22*b*4. The mold layer 70 may fill the sub-bar trench 22*t* between the first and second sub-bar patterns 22*b*1 and 22*b*2 and the sub-bar trench 22*t* between the fourth and fifth sub-bar patterns 22*b*4 and 22*b*5, which are not filled with the solder layer 66. In some example embodiments, an underfill resin layer or a non-conductive layer may fill the sub-bar trenches 22*t* which are not filled with the solder layer 66. Other structures and effects of the semiconductor package according to the present example embodiment may be the same as or substantially similar to those of the semiconductor package of FIGS. 11 and 12.

Figure 14:
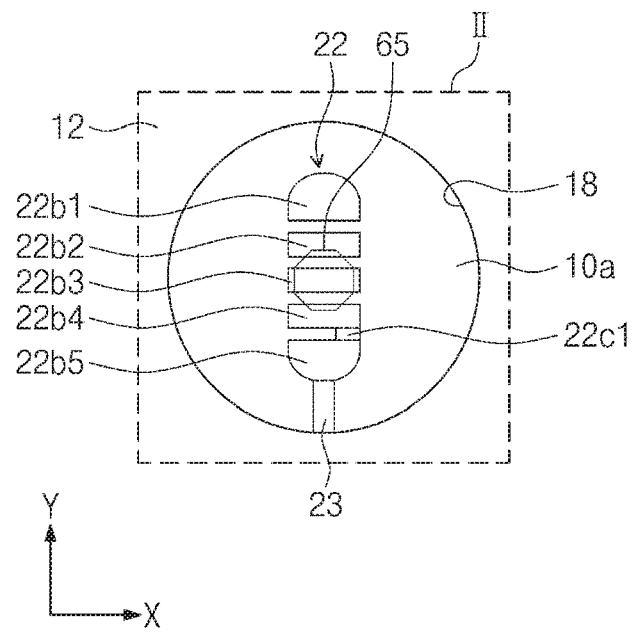
FIGS. 14 and 15 are enlarged plan views illustrating positions of solder portions when semiconductor chips are mounted on the package substrates of FIGS. 7 and 8, respectively.
Figure 15:
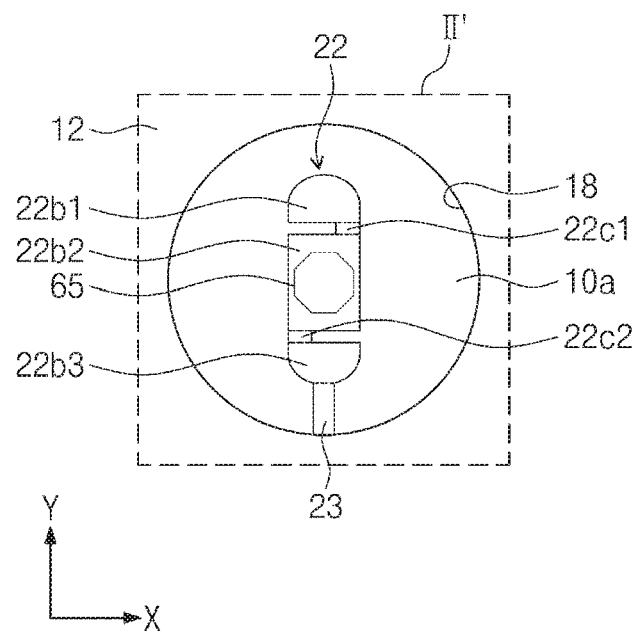

FIGS. 14 and 15 are enlarged plan views illustrating positions of solder portions when semiconductor chips are mounted on the package substrates of FIGS. 7 and 8, respectively.

Referring to FIG. 14, a solder portion 65 may be disposed to be in contact with the second to fourth sub-bar patterns 22b2 to 22b4 of FIG. 7 and the first surface 10a of the structure body 10 between the second to fourth sub-bar patterns 22b2 to 22b4 of FIG. 7. The second to fourth sub-bar patterns 22b2 to 22b4 are not electrically connected to each other before mounting the semiconductor chip 60. However, in the process of mounting the semiconductor chip 60, the solder portion 65 may come in contact with the second to fourth sub-bar patterns 22b2 to 22b4 and then may be finally formed into a solder layer 66. Thus, the second to fourth sub-bar patterns 22b2 to 22b4 may be electrically connected to each other by the solder layer 66. The solder layer 66 may extend within the second sub-bar pattern 22b2 and the fourth sub-bar pattern 22b4 along the second direction Y (e.g., Y axis). The solder layer 66 may not extend beyond the second sub-bar pattern 22b2 in an upward direction along the second direction Y (e.g., Y axis), and may not extend beyond the fourth sub-bar pattern 22b4 in a downward direction along the second direction Y (e.g., Y axis) due to the wettability difference between the first surface 10a and surfaces of the sub-bar patterns 22b2 to 22b4.

Referring to FIG. 15, a solder portion 65 may be disposed to be in contact with a top surface of the second sub-bar pattern 22b2 of FIG. 8 which has a relatively wide width in the second direction Y. A finally formed solder layer 66 may be disposed in only the second sub-bar pattern 22b2 when viewed in a plan view. The width and a shape of the second sub-bar pattern 22b2 may be adjusted to adjust a width and a shape of the solder layer 66 formed in a subsequent process.

FIGS. 16A to 16D are enlarged plan views illustrating first and second conductive pads having various shapes and bonding positions of solder portions, according to some example embodiments of the inventive concepts.

Figure 16A:
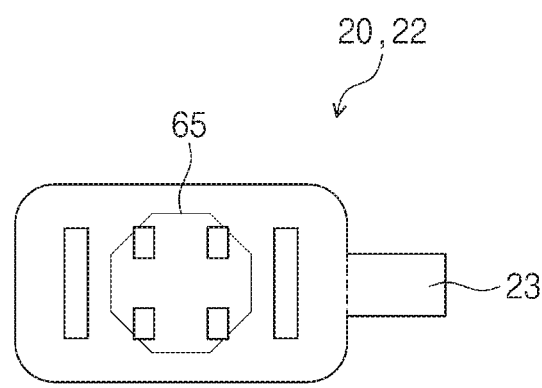
FIGS. 16A to 16D are enlarged plan views illustrating first and second conductive pads having various shapes and bonding positions of solder portions, according to some example embodiments of the inventive concepts.
Figure 16B:
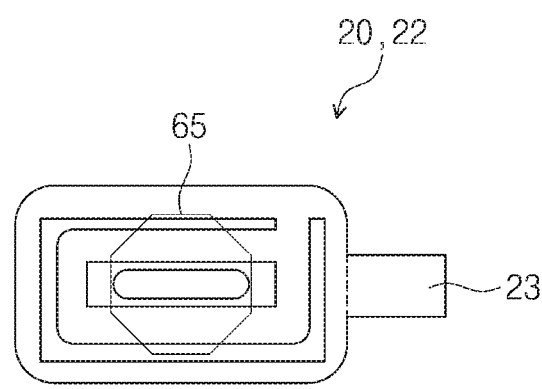
Figure 16C:
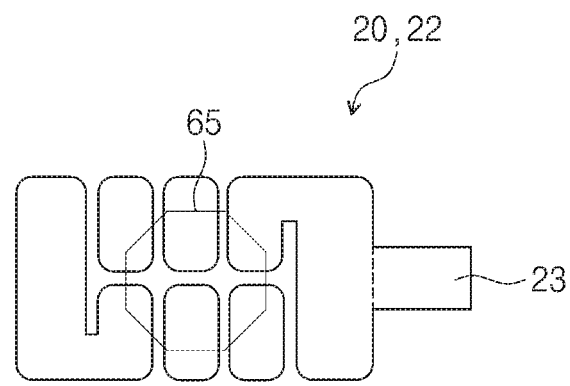
Figure 16D:
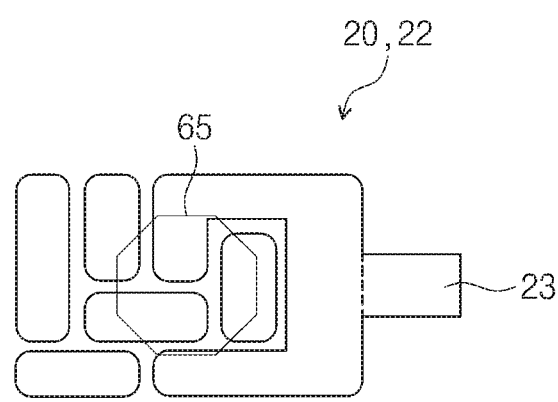

Referring to FIGS. 16A to 16D, first and second conductive pads 20 and 22 having various shapes may be formed by variously changing positions and shapes of the sub-bar patterns and the sub-connection patterns described with reference to FIG. 2. For example, each of the first and second conductive pads 20 and 22 may have a complicated closed loop shape as illustrated in FIG. 16A or 16B or may have a structure in which sub-bar patterns have various shapes as illustrated in FIG. 16C or 16D.

The package substrate according to example embodiments of the inventive concepts may inhibit, mitigate, or prevent the phenomenon that the solder layer spreads in the longitudinal direction when the semiconductor chip is mounted. Thus, it is possible to inhibit, mitigate, or prevent a solder crack defect from occurring in the semiconductor package. As a result, the semiconductor package with improved reliability may be provided or realized.

While the inventive concepts have been described with reference to some example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A package substrate comprising:
   a substrate body including a first surface on which a semiconductor chip is mounted and a second surface opposite to the first surface; and
   a conductive pad at the first surface, the conductive pad elongated in a first direction, the conductive pad including a plurality of sub-bar patterns spaced apart from each other in the first direction,
   wherein the conductive pad further comprises at least one sub-connection pattern connecting end portions of at least one pair of the sub-bar patterns to each other.

2. The package substrate of claim 1, wherein
   the sub-bar patterns comprise first, second, and third sub-bar patterns sequentially arranged in the first direction, and
   a width of the second sub-bar pattern in the first direction is greater than any of a width of the first sub-bar pattern and a width of the third sub-bar pattern in the first direction.

3. The package substrate of claim 1, further comprising:
   a protective layer on the first surface, the protective layer including an opening exposing the conductive pad, the protective layer not vertically overlapping the conductive pad.

4. The package substrate of claim 1, further comprising:
   a plurality of conductive pads including the conductive pad, the conductive pads at a central portion and an edge portion of the first surface, respectively; and
   a protective layer on the first surface, the protective layer including openings exposing the conductive pads,
   wherein the openings comprise a first opening exposing the conductive pads at the edge portion, and second openings exposing the conductive pads at the central portion,
   each of the second openings has a circular shape when viewed in a plan view, and
   the first opening has a rectangular loop shape when viewed in a plan view.

5. The package substrate of claim 1, wherein the first surface includes a trench, and the conductive pad is in the trench.

6. The package substrate of claim 5, wherein a top surface of the conductive pad is lower than the first surface.

7. The package substrate of claim 1, further comprising:
   a ball land at the second surface and to which a solder ball is bonded; and
   a protective layer on the second surface, the protective layer covering an edge portion of the ball land to define an opening exposing the ball land,
   wherein the ball land exposed by the opening has a continuous surface in the first direction.

8. A package substrate comprising:
   a substrate body including a first surface on which a semiconductor chip is mounted and a second surface opposite to the first surface; and
   a conductive pad at the first surface, the conductive pad elongated in a first direction, the conductive pad including trenches exposing the first surface, the trenches spaced apart from each other in the first direction,
   wherein the conductive pad further comprises,
   sub-bar patterns separated from each other by the trenches, and at least one sub-connection pattern connecting end portions of at least one pair of the sub-bar patterns to each other.

9. The package substrate of claim 8, wherein
the sub-bar patterns comprise first, second and third sub-bar patterns sequentially arranged in the first direction, and
a width of the second sub-bar pattern in the first direction is greater than a width of the first sub-bar pattern in the first direction and a width of the third sub-bar pattern in the first direction.

10. The package substrate of claim 9, further comprising:
a plurality of conductive pads including the conductive pad, the conductive pads at a central portion and an edge portion of the first surface, respectively; and
a protective layer on the first surface, the protective layer including openings exposing the conductive pads,
wherein the openings comprise a first opening exposing the conductive pads at the edge portion, and second openings exposing the conductive pads at the central portion,
each of the second openings has a circular shape when viewed in a plan view, and
the first opening has a square ring shape when viewed in a plan view.

11. A semiconductor package comprising:
a package substrate including,
  a substrate body including a first surface on which a semiconductor chip is mounted and a second surface opposite to the first surface, and
  a conductive pad at the first surface, the conductive pad elongated in a first direction, the conductive pad including a plurality of sub-bar patterns spaced apart from each other in the first direction;
the semiconductor chip on the package substrate; and
a mold layer covering the semiconductor chip,
wherein the conductive pad further comprises at least one sub-connection pattern connecting end portions of at least one pair of the sub-bar patterns to each other.

12. The semiconductor package of claim 11, wherein the semiconductor chip comprises:
a bump on a bottom surface of the semiconductor chip; and
a solder layer between the bump and the conductive pad, and the solder layer electrically connecting at least some of the sub-bar patterns to each other.

13. The semiconductor package of claim 12, wherein
the first surface includes a trench,
the conductive pad is in the trench such that a top surface of the trench is lower than the first surface, and
the solder layer is in contact with the first surface between the sub-bar patterns, and the solder layer is in contact with the first surface at an upper sidewall of the trench.

14. The semiconductor package of claim 12, wherein
the conductive pad is on the first surface, and
the solder layer is in contact with a sidewall of at least one of the sub-bar patterns.

15. The semiconductor package of claim 12, wherein
the sub-bar patterns comprise first, second and third sub-bar patterns arranged in a line in the first direction, and
the solder layer fills a space between the first and second sub-bar patterns.

16. The semiconductor package of claim 15, wherein the mold layer fills a space between the second and third sub-bar patterns.

17. The semiconductor package of claim 11, wherein the package substrate further comprises:
a ball land at the second surface; and
a solder ball bonded to the ball land,
wherein an interface between the solder ball and the ball land is continuous in the first direction.

* * * * *